(12) United States Patent
Kim

(10) Patent No.: US 12,100,681 B2
(45) Date of Patent: Sep. 24, 2024

(54) SEMICONDUCTOR PACKAGE AND METHOD OF FABRICATING THE SAME

(71) Applicant: SAMSUNG ELECTRONICS CO., LTD., Suwon-si (KR)

(72) Inventor: Young Lyong Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/491,551

(22) Filed: Oct. 20, 2023

(65) Prior Publication Data
US 2024/0047402 A1 Feb. 8, 2024

Related U.S. Application Data

(63) Continuation of application No. 17/366,145, filed on Jul. 2, 2021, now Pat. No. 11,817,411.

(30) Foreign Application Priority Data

Dec. 22, 2020 (KR) ........................ 10-2020-0181255

(51) Int. Cl.
*H01L 23/498* (2006.01)
*H01L 23/00* (2006.01)
*H01L 25/10* (2006.01)

(52) U.S. Cl.
CPC ........ *H01L 24/16* (2013.01); *H01L 23/49816* (2013.01); *H01L 23/49822* (2013.01); *H01L 23/49833* (2013.01); *H01L 23/49838* (2013.01); *H01L 24/05* (2013.01); *H01L 24/08* (2013.01); *H01L 24/09* (2013.01); *H01L 24/13* (2013.01); *H01L 24/17* (2013.01); *H01L 24/73* (2013.01); *H01L 24/81* (2013.01); *H01L 25/105* (2013.01); *H01L 2224/05147* (2013.01); *H01L 2224/05155* (2013.01); *H01L 2224/0807* (2013.01); *H01L 2224/0903* (2013.01); *H01L 2224/13111* (2013.01); *H01L 2224/16013* (2013.01); *H01L 2224/16059* (2013.01); *H01L 2224/16148* (2013.01); *H01L 2224/1703* (2013.01); *H01L 2224/73204* (2013.01);

(Continued)

(58) Field of Classification Search
CPC ....................................................... H01L 24/16
See application file for complete search history.

(56) References Cited

U.S. PATENT DOCUMENTS 6,548,898 B2 * 4/2003 Matsuki .................. H01L 24/94
257/772
6,583,514 B2 6/2003 Tago et al.
(Continued)

*Primary Examiner* — William A Harriston
(74) *Attorney, Agent, or Firm* — Fish & Richardson P.C.

(57) ABSTRACT

A semiconductor package including a first die, through electrodes penetrating the first die, a first pad on a top surface of the first die and coupled to a through electrode, a second die on the first die, a second pad on a bottom surface of the second die, a first connection terminal connecting the first pad to the second pad, and an insulating layer that fills a region between the first die and the second die and encloses the first connection terminal. The first connection terminal includes an intermetallic compound made of solder material and metallic material of the first and second pads. A concentration of the metallic material in the first connection terminal is substantially constant regardless of a distance from the first pad or the second pad.

20 Claims, 10 Drawing Sheets

(52) U.S. Cl.
CPC ............... *H01L 2224/81203* (2013.01); *H01L 2924/1431* (2013.01); *H01L 2924/1434* (2013.01)

(56) References Cited

U.S. PATENT DOCUMENTS

| | | | |
|---|---|---|---|
| 6,879,041 B2* | 4/2005 | Yamamoto | H05K 3/244 |
| | | | 257/781 |
| 7,547,577 B2* | 6/2009 | Card | H05K 3/4614 |
| | | | 438/114 |
| 7,727,805 B2 | 6/2010 | Skeete | |
| 8,378,485 B2 | 2/2013 | Bachman et al. | |
| 9,543,273 B2 | 1/2017 | Gruber et al. | |
| 9,559,072 B2 | 1/2017 | Lin | |
| 9,905,539 B2* | 2/2018 | Gandhi | H01L 24/16 |
| 10,175,294 B2 | 1/2019 | Wu et al. | |
| 10,256,216 B2* | 4/2019 | Gandhi | H01L 24/16 |
| 10,373,686 B2 | 8/2019 | Tran et al. | |
| 2007/0045869 A1* | 3/2007 | Ho | H01L 24/81 |
| | | | 257/E21.511 |
| 2012/0199981 A1* | 8/2012 | Jeong | H01L 25/50 |
| | | | 257/773 |
| 2012/0223433 A1 | 9/2012 | Jee et al. | |
| 2015/0179615 A1 | 6/2015 | Watanabe et al. | |

\* cited by examiner

SEMICONDUCTOR PACKAGE AND METHOD OF FABRICATING THE SAME

CROSS-REFERENCE TO RELATED APPLICATIONS

This application is a continuation of U.S. patent application Ser. No. 17/366,145, filed Jul. 2, 2021, which claims priority under 35 U.S.C. § 119 is made to Korean Patent Application No. 10-2020-0181255, filed on Dec. 22, 2020, in the Korean Intellectual Property Office, the entireties of which are hereby incorporated by reference.

BACKGROUND OF THE INVENTION

The present disclosure relates to semiconductor packages and methods of fabricating the same, and in particular to a stack-type semiconductor package and a method of fabricating the same.

Recently in the electronics industry there has been a greater effort to inexpensively manufacture electronic products that are lightweight, compact, high-speed and multifunctional, and that provide high-performance. Multi-chip stacked package or system-in-package technologies have been developed to achieve these goals. In multi-chip-stacked package or system-in-package structures, a single semiconductor package is configured to have various functions which can be realized by a plurality of semiconductor devices. A multi-chip-stacked package or a system-in-package structure may be slightly thicker than a typical single chip package, but may have area that is almost similar to a single chip package. Multi-chip stacked package and system-in-package structures are thus currently used in high-functional, compact, and portable products such as portable phones, laptop computers, memory cards, and portable camcorders.

SUMMARY

Embodiments of the inventive concepts provide a semiconductor package with improved structural stability and a method of fabricating the same.

Embodiments of the inventive concepts provide a method of fabricating a semiconductor package having low failure rate.

Embodiments of the inventive concepts provide a semiconductor package including a first die; through electrodes penetrating the first die; a first pad on a top surface of the first die and coupled to a through electrode from among the through electrodes; a second die on the first die; a second pad on a bottom surface of the second die; a first connection terminal connecting the first pad to the second pad; and an insulating layer filling a region between the first die and the second die and enclosing the first connection terminal. The first connection terminal includes an intermetallic compound made of a solder material and metallic material of the first pad and the second pad. A concentration of the metallic material in the first connection terminal is substantially constant regardless of a distance from the first pad or the second pad.

Embodiments of the inventive concepts further provide a semiconductor package including a first die; second dies stacked on a top surface of the first die, each of the second dies including a top surface and a bottom surface, a first pad and a second pad on the top surfaces of the second dies, and a third pad and a fourth pad on the bottom surfaces of the second dies; first connection terminals between the second dies, the first connection terminals respectively connect the first pads and the third pads that vertically overlap each other; second connection terminals between the second dies, the second connection terminals respectively connect the second pads and the fourth pads that vertically overlap each other; an insulating layer filling regions between the second dies; and outer terminals on a bottom surface of the first die and connecting the first die to a substrate. The first pads and the third pads are disposed adjacent to side surfaces of the second dies, and distances between the first and third pads and the side surfaces of the second dies are less than distances between the second and fourth pads and the side surfaces of the second dies. The first connection terminals include an intermetallic compound made of a solder material and metallic material of the first pads and the third pads. The second connection terminals include an intermetallic compound made of the solder material and metallic material of the second pads and the fourth pads. The first connection terminals further respectively include solder portions protruding from side surfaces of the first connection terminals toward the side surfaces of the second dies. The solder portions of the first connection terminals include the solder material and do not include the metallic material of the first connection terminals.

Embodiments of the inventive concepts still further provide a method of fabricating a semiconductor package including providing a first die having a first pad; providing a second die having a second pad; providing a solder material layer on the second pad; forming a preliminary insulating layer on a surface of the second die to cover the second pad and the solder material layer; placing the second die on the first die such that the first pad is aligned to the second pad; and performing a thermocompression bonding process on the second pad to form a connection terminal connecting the first pad to the second pad, and an insulating layer enclosing the first pad, the second pad and the connection terminal. During the thermocompression bonding process metallic material of the first pad and the second pad may be diffused into the solder material layer to form the connection terminal, and the preliminary insulating layer may be hardened to form the insulating layer. A portion of the solder material layer, which does not form an intermetallic compound with the metallic material, inflows into the insulating layer to form a solder portion.

DETAILED DESCRIPTION

Example embodiments of the inventive concepts will now be described more fully with reference to the accompanying drawings, in which example embodiments are shown.

Figure 1:
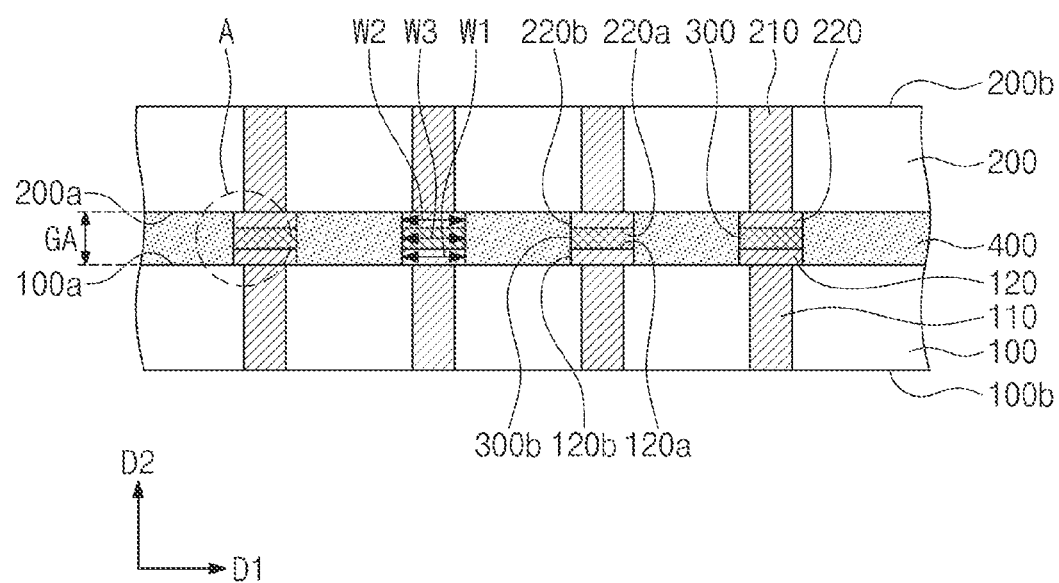
FIG. 1 illustrates a sectional view of a semiconductor package according to embodiments of the inventive concepts.

FIG. 1 illustrates a sectional view of a semiconductor package according to embodiments of the inventive concepts. FIGS. 2, 3, 4 and 5 respectively illustrate enlarged sectional views of a portion 'A' of FIG. 1.

Figure 2:
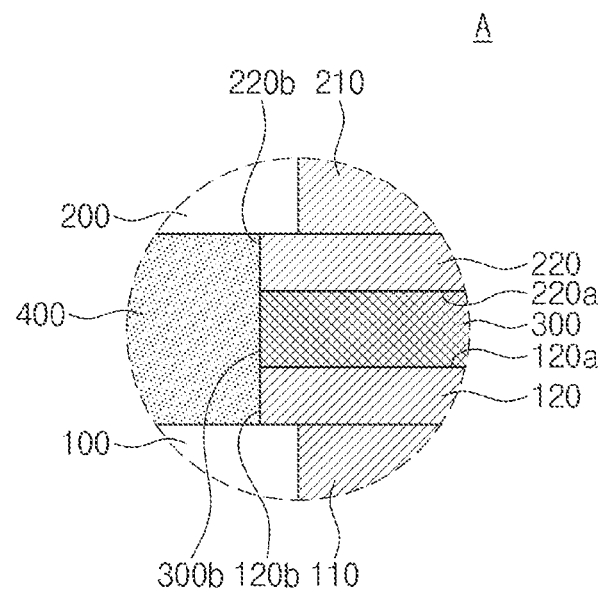
FIGS. 2, 3, 4 and 5 respectively illustrate enlarged sectional views of a portion 'A' of FIG. 1.

Referring to FIGS. 1 and 2, a first die 100 may be provided. The first die 100 may be formed of or include a semiconductor material. For example, the first die 100 may include a silicon substrate, a germanium substrate, a silicon-germanium substrate, or the like. A first active region (not shown), which includes a semiconductor device and an electrical pathway, may be provided in an upper or lower portion of the first die 100.

A first through electrode 110 (e.g., a through silicon via (TSV)) may be provided in the first die 100. The first through electrode 110 may be provided to vertically penetrate the first die 100. The first through electrode 110 may be used as a path for electrical connection between the first active region and another semiconductor die (not shown), or between the first active region and a package substrate (not shown). The first through electrode 110 may extend from a top surface 100a of the first die 100 to a bottom surface 100b of the first die 100. The first through electrode 110 may extend in a second direction D2 that is perpendicular to the top surface 100a of the first die 100, and the top surface 100a of the first die 100 may be planar and extend along a first direction D1. The first through electrode 110 may have a top surface that is substantially coplanar with the top surface 100a of the first die 100. The first through electrode 110 may have a multi-layered structure. For example, the first through electrode 110 may include a conductive layer (not shown) which extends in the second direction D2, and at least one of an insulating layer (not shown) or a diffusion barrier layer (not shown) which is provided to enclose a side surface of the conductive layer. In an embodiment, the conductive layer may be formed of or include at least one of metallic materials (e.g., copper (Cu)).

A plurality of the first through electrodes 110 may be provided. In this case, the first through electrodes 110 may be provided in the first die 100 to be horizontally spaced apart from each other. For example, the first through electrodes 110 may be arranged to be spaced apart from each other along a first direction D1 parallel to the top surface 100a of the first die 100. The first direction D1 may be chosen to be parallel to the top surface 100a of the first die 100 but in other embodiments the first direction D1 may not be fixed to a specific direction. The first through electrodes 110 may be arranged to be spaced apart from each other by a constant distance. Alternatively, a distance between the first through electrodes 110 may not be constant.

A first pad 120 may be provided on the first die 100. The first pad 120 may be vertically aligned to the first through electrode 110. For example, the first pad 120 may be provided to cover the top surface of the first through electrode 110 and may extend to cover at least a portion of the top surface 100a of the first die 100. In other words, a bottom surface of the first pad 120 may include two portions, which portions being respectively in contact with the top surface of the first through electrode 110 and the top surface 100a of the first die 100. When viewed in plan view, at least a portion of the first pad 120 (e.g., a center portion of the first pad 120) may overlap with the entire top surface of the first through electrode 110. When measured along the first direction D1, a width W1 of the first pad 120 may range from 1 μm to 15 μm. The first pad 120 may include a first metallic material. For example, the first metallic material may include copper (Cu) or nickel (Ni). Although FIG. 1 illustrates an example in which the first pad 120 has a single-layered structure, the inventive concepts are not limited to this example, and in other embodiments the first pad 120 may have a multi-layered structure. For example, the first pad 120 may include a first layer and a second layer, which are sequentially stacked and are formed of or include different materials. For example, in an embodiment the first layer may be formed of or include copper (Cu), and the second layer may be formed of or include nickel (Ni). Here, each of the first and second layers may consist of a plurality of layers, and in this case, the first and second layers may be alternately stacked. Alternatively, the first pad 120 may be an electroless-nickel immersion-gold (ENIG) pad including nickel (Ni) and gold (Au) layers formed on a copper (Cu) layer by an electroless plating method and a displacement plating method, respectively. However, for the sake of brevity, the following description will refer to the structure of FIG. 1.

In the case where a plurality of the first through electrodes 110 are provided, a plurality of the first pad 120 may also be provided. In this case, the first pads 120 may be respectively provided on the first through electrodes 110. In an embodiment, some of the first pads 120 may be provided on the top surface 100a of the first die 100, but not on the first through electrodes 110.

A second die 200 may be provided on the first die 100. The second die 200 may be formed of or include a semiconductor material. For example, the second die 200 may include a silicon substrate, a germanium substrate, or a silicon-germanium substrate or the like. A second active region (not shown) which includes a semiconductor device and an electrical pathway may be provided in an upper or lower portion of the second die 200. A distance between the second die 200 and the first die 100 may range from 1 μm to 10 μm. In other words, a distance GA between a bottom surface 200a of the second die 200 and the top surface 100a of the first die 100 may range from 1 μm to 10 μm.

A second through electrode 210 (e.g., a through silicon via (TSV)) may be provided in the second die 200. The second through electrode 210 may be provided to vertically penetrate the second die 200. The second through electrode 210 may be used as a path for electrical connection between the second active region and another semiconductor die (not shown), or between the second active region and a package substrate (not shown). The second through electrode 210 may extend from the bottom surface 200a of the second die 200 to a top surface 200b of the second die 200. The second through electrode 210 may extend in the second direction D2. A bottom surface of the second through electrode 210 may be coplanar with the bottom surface 200a of the second die 200. The second through electrode 210 may have a multi-layered structure. For example, the second through electrode 210 may include a conductive layer (not shown) which extends in the second direction D2, and at least one of an insulating layer (not shown) or a diffusion barrier layer (not shown) which is provided to enclose a side surface of the conductive layer. In an embodiment, the conductive layer may be formed of or include at least one of metallic materials (e.g., copper (Cu)).

A plurality of the second through electrode 210 may be provided. In this case, the second through electrodes 210 may be provided in the second die 200 to be horizontally spaced apart from each other. For example, the second through electrodes 210 may be arranged as spaced apart from each other along the first direction D1. The second through electrodes 210 may be arranged to be spaced apart from each other by a constant distance. Alternatively, a distance between the second through electrodes 210 may not be constant.

A second pad 220 may be provided below the second die 200. The second pad 220 may be vertically aligned to the second through electrode 210. For example, the second pad 220 may be provided to cover the bottom surface of the second through electrode 210 and may extend to cover at least a portion of the bottom surface 200a of the second die 200. As an example, a top surface of the second pad 220 may include two portions which are respectively in contact with the bottom surface of the second through electrode 210 and the bottom surface 200a of the second die 200. When viewed in plan view, at least a portion of the second pad 220 (e.g., a center portion of the second pad 220) may overlap with the entire bottom surface of the second through electrode 210. When measured along the first direction D1, a width W2 of the second pad 220 may range from 1 μm to 15 μm. The second pad 220 may include a second metallic material. For example, the second metallic material may include copper (Cu) or nickel (Ni). The second metallic material of the second pad 220 may be the same material as the first metallic material of the first pad 120. However, the inventive concepts are not limited to this example, and in other embodiments the second metallic material of the second pad 220 may be a metallic material that is different from the first metallic material of the first pad 120. Although FIG. 1 illustrates an example in which the second pad 220 has a single-layered structure, the inventive concepts are not limited to this example, and in other embodiments the second pad 220 may have a multi-layered structure. For example, the second pad 220 may include a first layer and a second layer, which are sequentially stacked and are formed of or include different materials. In an embodiment, the first layer may be formed of or include copper (Cu), and the second layer may be formed of or include nickel (Ni). Here, a plurality of first layers and a plurality of second layers may be provided, and the first layers and the second layers may be alternately stacked. However, for the sake of brevity, the following description will refer to the structure of FIG. 1.

In the case where a plurality of the second through electrodes 210 are provided, a plurality of the second pads 220 may also be provided. In this case, the second pads 220 may be respectively provided on the second through electrodes 210. In an embodiment, some of the second pads 220 may be provided on the bottom surface 200a of the second die 200 but not on the second through electrodes 210.

The second pad 220 may be vertically aligned to the first pad 120. For example, the second pad 220 may be located on (or over) the first pad 120 in the second direction D2. Side surfaces 220b of the second pad 220 may be aligned to side surfaces 120b of the first pad 120 vertically (i.e., in the second direction D2). When measured along the first direction D1, the width W2 of the second pad 220 may be substantially equal to the width W1 of the first pad 120. However, the inventive concepts are not limited to this example, and in other embodiments the width W2 of the second pad 220 may be larger or smaller than the width W1 of the first pad 120. In this case, at least a portion of a wider one of the first and second pads 120 and 220 may overlap with the entirety of a narrower one of the first and second pads 120 and 220.

A connection terminal 300 may be provided between the first and second pads 120 and 220. The connection terminal 300 may be in contact with a top surface 120a of the first pad 120 and a bottom surface 220a of the second pad 220. For example, the connection terminal 300 may be provided to fill a space between the first and second pads 120 and 220. When measured along the first direction D1, a width W3 of the connection terminal 300 may be substantially equal to the width W1 of the first pad 120 and the width W2 of the second pad 220. Side surfaces 300b of the connection terminal 300 may connect and be contiguous with the side surfaces 120b of the first pad 120 to the side surfaces 220b of the second pad 220. For example, the side surfaces 300b of the connection terminal 300 may be vertically aligned with the side surfaces 120b of the first pad 120 and the side surfaces 220b of the second pad 220. The side surfaces 300b of the connection terminal 300 may be substantially coplanar with the side surfaces 120b of the first pad 120 and the side surfaces 220b of the second pad 220. The side surfaces 300b of the connection terminal 300, the side surfaces 120b of the first pad 120, and the side surfaces 220b of the second pad 220 may be substantially flat along a same plane.

In other embodiments, the side surfaces 300b of the connection terminal 300 may not be flat.

Figure 3:
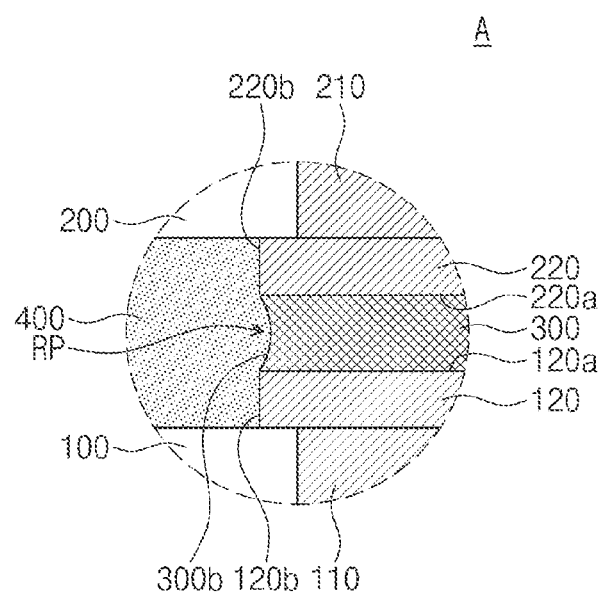

As shown in FIG. 3, the side surface 300b of the connection terminal 300 may have a concave portion RP that is inwardly recessed. A depth of the concave portion RP (i.e., a recess depth of the side surface 300b from the side surface 120b of the first pad 120 to a bottom surface of the concave portion RP which may be characterized as along the first direction D1 for example) may be larger than 0 μm and may be smaller than or equal to 2 μm. At a boundary between the connection terminal 300 and the first pad 120 a width of the connection terminal 300 may be equal to a width of the first pad 120, and at a boundary between the connection terminal 300 and the second pad 220 the width of the connection terminal 300 may be equal to a width of the second pad 220. A width of a center portion of the connection terminal 300 may be smaller than the width of the first pad 120 and the width of the second pad 220.

Figure 4:
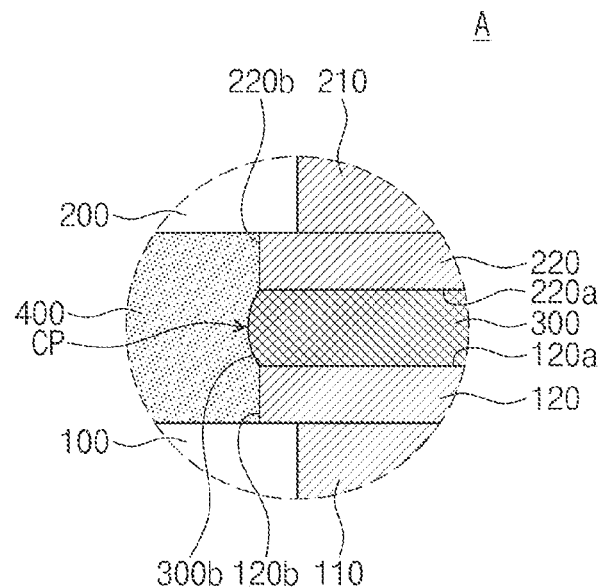

Alternatively, as shown in FIG. 4, the side surface 300b of the connection terminal 300 may have a convex portion CP protruding outwardly. A horizontal length of the convex portion CP (i.e., a protruding length of the side surface 300b from the side surface 120b of the first pad 120 to a ridge of the convex portion CP which may be characterized as along the first direction D1 for example) may be larger than 0 μm and may be smaller than or equal to 2 μm. At a boundary between the connection terminal 300 and the first pad 120 the width of the connection terminal 300 may be equal to the width of the first pad 120, and at a boundary between the connection terminal 300 and the second pad 220 the width of the connection terminal 300 may be equal to the width of the second pad 220. The width of the center portion of the connection terminal 300 may be larger than the width of the first pad 120 and the width of the second pad 220.

In other embodiments, the side surfaces 300b of the connection terminal 300 may not be coplanar with the side surfaces 120b of the first pad 120 and the side surfaces 220b of the second pad 220.

Figure 5:
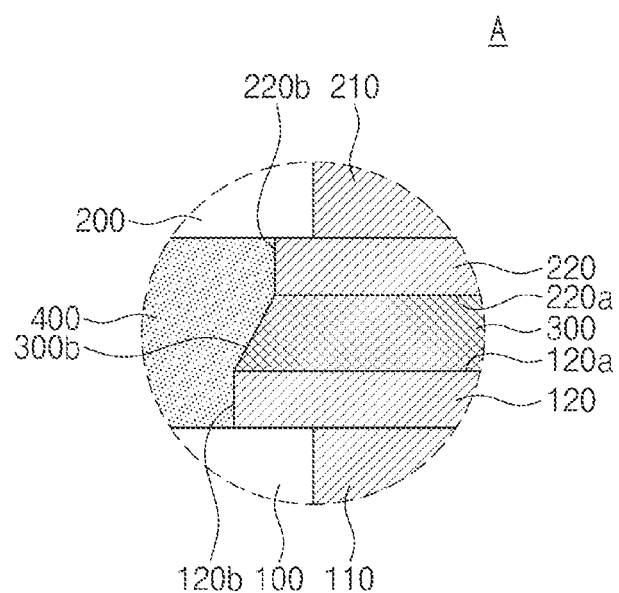

As shown in FIG. 5, the width of the first pad 120 may be larger than the width of the second pad 220. In this case, the side surfaces 120b of the first pad 120 may not be positioned along the same plane as the side surfaces 220b of the second pad 220. The side surfaces 300b of the connection terminal 300 may connect the side surfaces 120b of the first pad 120 to the side surfaces 220b of the second pad 220. In this case, the side surfaces 300b of the connection terminal 300 may be inclined at an angle to the side surfaces 120b of the first pad 120 and the side surfaces 220b of the second pad 220. On a boundary between the connection terminal 300 and the first pad 120 the width of the connection terminal 300 may be equal to the width of the first pad 120, and on a boundary between the connection terminal 300 and the second pad 220 the width of the connection terminal 300 may be equal to the width of the second pad 220. The width of the center portion of the connection terminal 300 may be smaller than the width of the first pad 120 and may be larger than the width of the second pad 220. In FIG. 5, the width of the first pad 120 is illustrated to be larger than the width of the second pad 220, but in other embodiments the width of the second pad 220 may be larger than the width of the first pad 120. In this case, the side surfaces 300b of the connection terminal 300 may connect the side surfaces 120b of the first pad 120 to the side surfaces 220b of the second pad 220. In this case, the side surfaces 300b of the connection terminal 300 may be inclined at an angle to the side surfaces 120b of the first pad 120 and the side surfaces 220b of the second pad 220.

The description that follows will refer to an embodiment of FIG. 2.

Referring further to FIGS. 1 and 2, at an interface of the first pad 120 and the connection terminal 300, a surface roughness of the top surface 120a of the first pad 120 (or a surface roughness of the bottom surface of the connection terminal 300) may be higher than a surface roughness of the bottom surface of the first pad 120. At an interface of the second pad 220 and the connection terminal 300, a surface roughness of the bottom surface 220a of the second pad 220 (or a surface roughness of the top surface of the connection terminal 300) may be higher than a surface roughness of the top surface of the second pad 220.

The connection terminal 300 may be formed of or include an intermetallic compound (IMC) between the first metallic material of the first pad 120 and the solder material, or between the second metallic material of the second pad 220 and the solder material. This will be described in more detail with reference to a fabrication method of a semiconductor package hereinafter. In the present specification, an intermetallic compound means a solid-state metallic alloy made of two or more metallic elements. In the present specification, a solder material means a material used for a soldering process and is not limited to a lead-based material. In other words, the solder material is not limited to tin-lead alloys and may include tin-based and lead-free solder materials. In an embodiment, the connection terminal 300 may be a pattern that is formed when the first and second metallic materials of the first and second pads 120 and 220 are diffused into the solder material layer provided between the first and second pads 120 and 220. For example, the first and second metallic materials of the first and second pads 120 and 220 may be formed of or include copper (Cu) or nickel (Ni), and the solder material may be formed of or include tin (Sn). In this case, the connection terminal 300 may be formed of or include at least one of copper-tin intermetallic compounds $Cu_xSn_y$ (e.g., $Cu_3Sn$ or $Cu_6Sn_5$), nickel-tin intermetallic compounds $Ni_xSn_y$ (e.g., $Ni_3Sn_4$), or nickel-copper-tin intermetallic compounds (e.g., $(Ni,Cu)_xSn_y$). In an embodiment, a concentration of each or at least one of the first and second metallic materials in the connection terminal 300 may be constant, regardless of a distance from the first or second pad 120 or 220.

In general, the first and second metallic materials of the first and second pads 120 and 220 may be diffused into the solder ball provided between the first and second pads 120 and 220, during a process of bonding semiconductor dies (e.g., a reflow process of a solder ball). Thus, interface layers, which are made of an intermetallic compound, may be formed between the first pad 120 and the solder ball, and between the second pad 220 and the solder ball. In this case, three material layers may be formed between the first and second pads 120 and 220, and thus, an electrical resistance of an electric path connecting the first pad 120 to the second pad 220 may be increased. Furthermore, the interfaces between the solder ball and the interface layers may serve as a starting point of a crack and may be weak to an external impact. That is, if interfaces exist between the solder ball and the interface layers, structural stability of the solder ball may be deteriorated. In addition, during the reflow process, the solder material in the solder ball may diffuse or migrate into the interface layer, and such a diffusion or migration of the solder material may cause formation of an empty space (e.g., a void) in the solder ball. The presence of the void may deteriorate the structural stability of the solder ball.

However, according to embodiments of the inventive concepts, the connection terminal 300, which is formed of just one material (i.e., the intermetallic compound), may be provided between the first and second pads 120 and 220. That is, an interface between material layers may be absent in the connection terminal 300, and thus the structural stability of the connection terminal 300 may be improved. In addition, since the first or second metallic material in the connection terminal 300 has a constant concentration, formation or the occurrence of a defect (e.g., a void) in the connection terminal 300 may be avoided. This will be described in more detail with reference to a fabrication method of a semiconductor package.

Referring further to FIGS. 1 and 2, in the case where a plurality of the first pads 120 and a plurality of the second pads 220 are provided, a plurality of the connection terminals 300 may also be provided. In this case, each of the connection terminals 300 may be provided between a corresponding pair of the first and second pads 120 and 220.

An insulating layer 400 may be provided between the first and second dies 100 and 200. The insulating layer 400 may be provided to fill a space between the first and second dies 100 and 200. The insulating layer 400 may also be provided to enclose the first pad 120, the second pad 220, and the connection terminal 300. The insulating layer 400 may protect the first pad 120, the second pad 220, and the connection terminal 300 from an external impact. The side surface 120b of the first pad 120, the side surface 220b of the second pad 220, and the side surface 300b of the connection terminal 300 may be in contact with the insulating layer 400. The insulating layer 400 may for example include a non-conductive film (NCF) or a non-conductive paste (NCP).

In the case where a plurality of semiconductor dies (not shown) are stacked on the package substrate (not shown), the insulating layer 400 may be provided between adjacent ones of the semiconductor dies and/or between the package substrate and one of the semiconductor dies. For example, the insulating layer 400 may be provided to fill spaces between adjacent ones of the semiconductor dies and/or between the package substrate and one of the semiconductor dies. The insulating layer 400 may protect the semiconductor dies and/or the package substrate and may attach adjacent ones of the semiconductor dies to each other or the package substrate to one of the semiconductor dies adjacent thereto.

Figure 6:
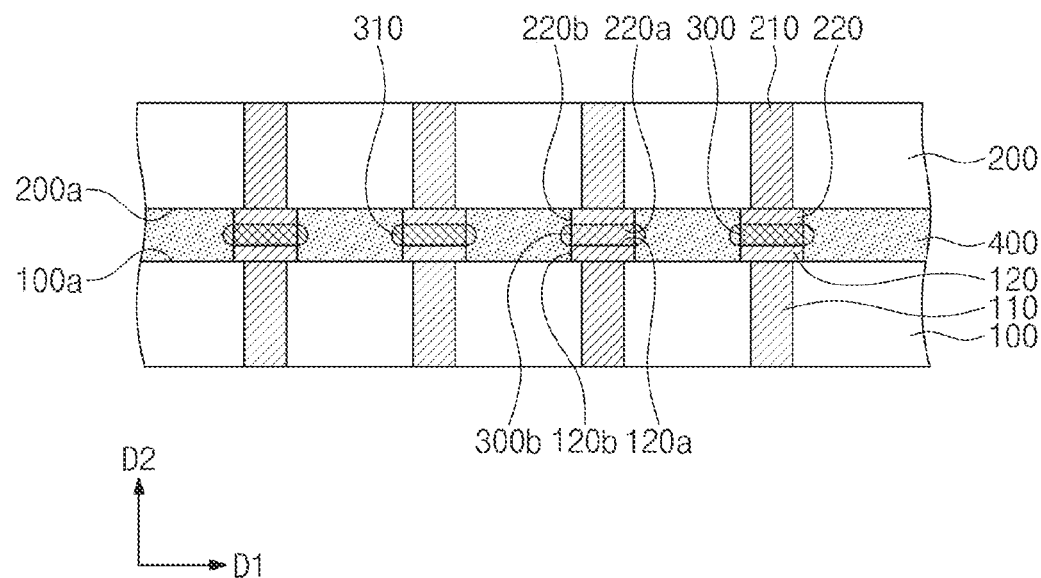
FIG. 6 illustrates a sectional view of a semiconductor package according to embodiments of the inventive concepts.

FIG. 6 illustrates a sectional view of a semiconductor package according to embodiments of the inventive concepts.

Referring to FIG. 6, a solder portion 310 may be further provided on the side surface 300*b* of the connection terminal 300. The solder portion 310 may protrude from the side surface 300*b* of the connection terminal 300 toward an inner region of the insulating layer 400. When viewed in plan view, the solder portion 310 may be provided to enclose the connection terminal 300. Here, the solder portion 310 is not provided between the first and second pads 120 and 220. The solder portion 310 is not in contact with the top surface 120*a* of the first pad 120 and the bottom surface 220*a* of the second pad 220. The solder portion 310 is spaced apart from the side surface 120*b* of the first pad 120 and the side surface 220*b* of the second pad 220. When measured along the first direction D1, a width of the solder portion 310 may range from 2 μm to 4 μm. A length of the solder portion 310 along the second direction D2 may be equal to or smaller than a length of the connection terminal 300 along the second direction D2. Alternatively, the length of the solder portion 310 along the second direction D2 may be larger than the length of the connection terminal 300 along the second direction D2. In this case, a portion of the solder portion 310 may be located over the side surface 120*b* of the first pad 120 or the side surface 220*b* of the second pad 220, and may be spaced apart from the side surface 120*b* of the first pad 120 or the side surface 220*b* of the second pad 220. The solder portion 310 may be formed of or include the solder material. The solder material of the solder portion 310 may be a same material as a solder material which is mixed with the first metal of the first pad 120 or the second metal of the second pad 220 to form the intermetallic compound of the connection terminal 300. For example, the solder portion 310 may be a remaining portion of the solder ball which is an outwardly-ejected portion of the connection terminal 300 after mixing the solder ball with the first metal and the second metal to form the connection terminal 300, in a process of bonding semiconductor dies. In other words, the first pad 120 may be formed of the first metal, the second pad 220 may be formed of the second metal, the solder portion 310 may be formed of the solder material, and the connection terminal 300 may be formed of an intermetallic compound of the first metal, the second metal, and the solder material. Here, the solder portion 310 may not include the first and second metals.

Figure 7:
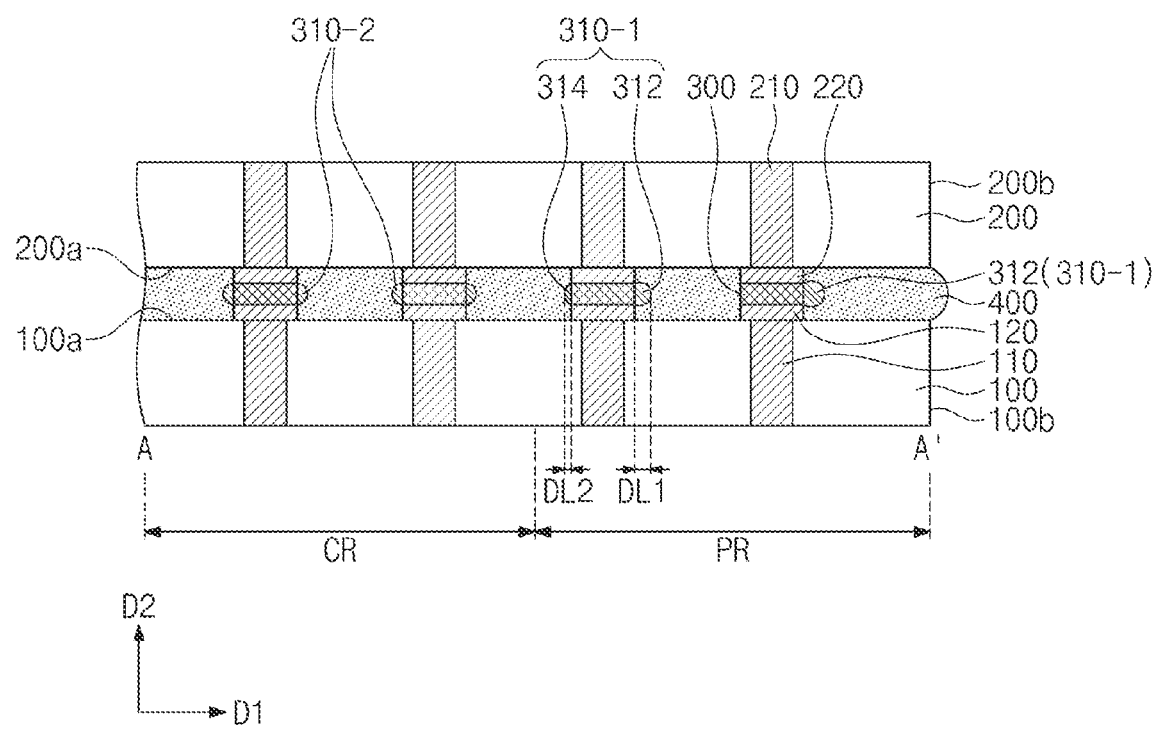
FIG. 7 illustrates a sectional view of a semiconductor package according to embodiments of the inventive concepts.
Figure 8:
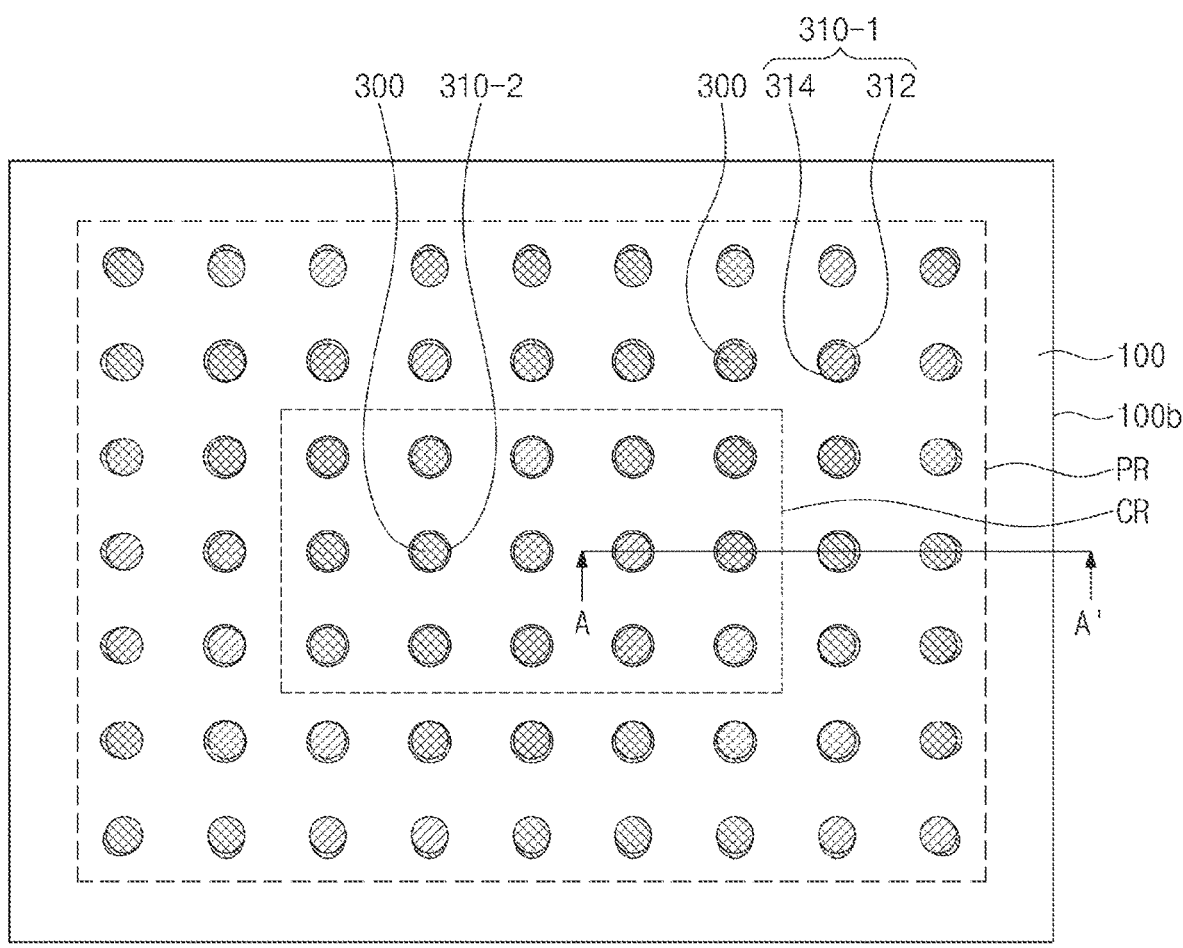
FIG. 8 illustrates a plan view of a semiconductor package according to embodiments of the inventive concepts.

The width of the solder portion 310 may vary depending on a position on the first die 100. FIG. 7 illustrates a sectional view of a semiconductor package according to embodiments of the inventive concepts. FIG. 8 illustrates a plan view of a semiconductor package according to embodiments of the inventive concepts, and in particular schematically illustrates arrangement of connection terminals in a semiconductor package. FIG. 7 corresponds to a section taken along a line A-A' of FIG. 8.

Referring to FIGS. 7 and 8, the first die 100 may have a center region CR and a peripheral region PR. When viewed in plan view, the peripheral region PR may enclose the center region CR. Some of the connection terminals 300 may be disposed on the peripheral region PR, and others of the connection terminals 300 may be disposed on the center region CR.

The solder portions 310 may be provided on the side surfaces 300*b* of the connection terminals 300. When viewed in plan view, each of the solder portions 310 may be provided to enclose a corresponding one of the connection terminals 300. For convenience, the description that follows will refer to a structure consisting of one of the first pads 120, one of the second pads 220, one of the connection terminals 300, and one of the solder portions 310 which are coupled to each other. The solder portions 310 may include peripheral solder portions 310-1 disposed on the peripheral region PR and center solder portions 310-2 disposed on the center region CR.

The center solder portion 310-2 may be provided to enclose the connection terminal 300 on the center region CR. A length of the center solder portion 310-2 protruding from the side surface 300*b* of the connection terminal 300 (i.e., the width of the center solder portion 310-2 in the first direction D1) may be constant regardless of a position in the center region CR. Here, the first direction D1 may be chosen to be parallel to the top surface 100*a* of the first die 100. As shown in FIG. 8, when viewed in plan view, the connection terminal 300 on the center region CR may be located on a center portion of the center solder portion 310-2, and a distance from the side surface 300*b* of the connection terminal 300 to an outer side surface of the center solder portion 310-2 may be constant regardless of a direction.

Referring back to FIGS. 7 and 8, the peripheral solder portion 310-1 may be provided to enclose the connection terminal 300 on the peripheral region PR. A length of the peripheral solder portion 310-1 protruding from the side surface 300*b* of the connection terminal 300 (i.e., the width of the peripheral solder portion 310-1 in the first direction D1) may depend on a direction. As shown in FIG. 8, when viewed in plan view, a distance from the side surface 300*b* of the connection terminal 300 to an outer side surface of the peripheral solder portion 310-1 on the peripheral region PR may have a direction-dependent value. For example, the peripheral solder portion 310-1 may include a first portion 312 which is adjacent to a side surface 100*b* of the first die 100 or a side surface 200*b* of the second die 200, and a second portion 314 which is far apart from the side surface 100*b* or 200*b* of the first or second die 100 or 200. In this case, a width DL1 of the first portion 312 may be larger than a width DL2 of the second portion 314. In other words, the smaller the distance to the side surface 100*b* or 200*b* of the first or second die 100 or 200, the greater the length of the peripheral solder portion 310-1 protruding from the side surface 300*b* of the connection terminal 300.

The connection terminals 300 and the peripheral solder portions 310-1 enclosing the connection terminals 300, respectively may be provided on the peripheral region PR. Here, the closer the peripheral solder portions 310-1 to the side surface 100*b* or 200*b*, the larger the difference between the widths DL1 and DL2 of the first and second portions 312 and 314. For example, the peripheral solder portion 310-1, which is most adjacent to the side surface 100*b* or 200*b*, may include only a portion protruding from the connection terminal 300 toward the side surface 100*b* or 200*b*. In other words, the width DL2 of the second portion 314 may be zero. Thus, a portion of a side surface of the connection terminal 300 opposite to the side surface 100*b* or 200*b* may be in contact with the insulating layer 400. For the peripheral solder portion 310-1 closest to the center region CR, the difference between the widths DL1 and DL2 of the first and second portions 312 and 314 may have a small value.

The insulating layer 400 may be provided between the first and second dies 100 and 200. The insulating layer 400 may be provided to fill a space between the first and second dies 100 and 200. The insulating layer 400 may be provided to enclose the first pad 120, the second pad 220, and the connection terminal 300. In an embodiment, a portion of the insulating layer 400 may protrude outwardly relative to the side surface 100b or 200b of the first or second dies 100 or 200.

FIGS. 9 to 16 illustrate sectional views descriptive of a method of fabricating a semiconductor package, according to embodiments of the inventive concepts.

Figure 9:
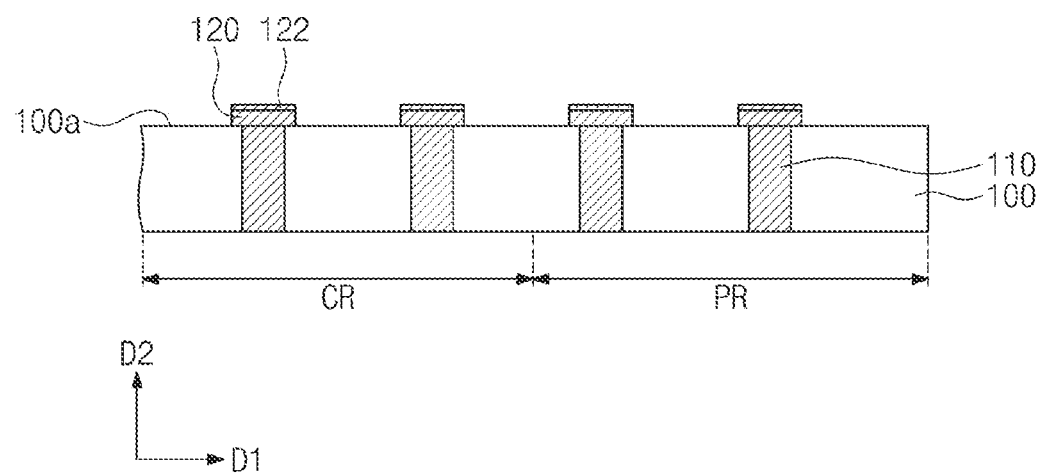
FIGS. 9, 10, 11, 12, 13, 14, 15 and 16 illustrate sectional views descriptive of a method of fabricating a semiconductor package, according to embodiments of the inventive concepts.

Referring to FIG. 9, the first die 100 may be provided. The first die 100 may be formed of or include a semiconductor material. For example, the first die 100 may be a silicon substrate, a germanium substrate, or a silicon-germanium substrate or the like. The first die 100 may have the center region CR and the peripheral region PR enclosing the center region CR, when viewed in plan view.

The first through electrode 110 may be formed in the first die 100. The formation of the first through electrode 110 may include forming a penetration hole (not shown) in the first die 100, depositing a conductive material layer (not shown) to fill the penetration hole, and planarizing or etching the conductive material layer to expose the top surface 100a of the first die 100. In an embodiment, the penetration hole may be formed by a dry etching process or a wet etching process. In an embodiment, the conductive material layer may for example be deposited by at least one of chemical vapor deposition (CVD), plasma-enhanced CVD (PECVD), high density plasma CVD (HDP-CVD), sputtering, metal organic CVD (MOCVD), and atomic layer deposition (ALD) methods. The first through electrode 110 may be formed of or include at least one of conductive materials. For example, the first through electrode 110 may be formed of at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr).

The first pad 120 may be formed on the first through electrode 110. For example, the formation of the first pad 120 may include forming a metal layer (not shown) on the first die 100 and removing a portion of the metal layer. The process of forming the metal layer may be performed using at least one of chemical vapor deposition (CVD), physical vapor deposition (PVD), and atomic layer deposition (ALD) methods. The process of removing the portion of the metal layer may include patterning the metal layer using a patterning mask (not shown). Alternatively, the formation of the first pad 120 may include forming a patterning mask (not shown), forming a metal layer on the patterning mask and the first die 100, and lifting off a portion of the metal layer located on the patterning mask. The first pad 120 may be formed of or include at least one of conductive materials. The first pad 120 may be formed of or include a first metal. For example, the first metal may include copper (Cu), nickel (Ni), or alloys. In an embodiment, a plurality of the first pads 120 may be provided. For example, the first pads 120 may be respectively formed on the first through electrodes 110.

An oxidation-preventing layer 122 may be formed on the first pad 120. In an embodiment, the formation of the first pad 120 may include forming a preliminary oxidation-preventing layer on the metal layer. The oxidation-preventing layer 122 may be formed on the first pad 120 by patterning the metal layer and the preliminary oxidation-preventing layer. The oxidation-preventing layer 122 may prevent the first pad 120 from being oxidized until a soldering process is performed on the first die 100 and the second die 200 in a subsequent step. The oxidation-preventing layer 122 may be formed to cover the top surface of the first pad 120. A width of the oxidation-preventing layer 122 along the first direction D1 may be equal to a width of the first pad 120 along the first direction D1. The oxidation-preventing layer 122 may be formed of or include a material that has lower reactivity than the first pad 120. The oxidation-preventing layer 122 may be formed of or include a material having an excellent wetting property with respect to a solder material layer to be described hereinafter. The oxidation-preventing layer 122 may be formed of or include, for example, gold (Au).

Figure 10:
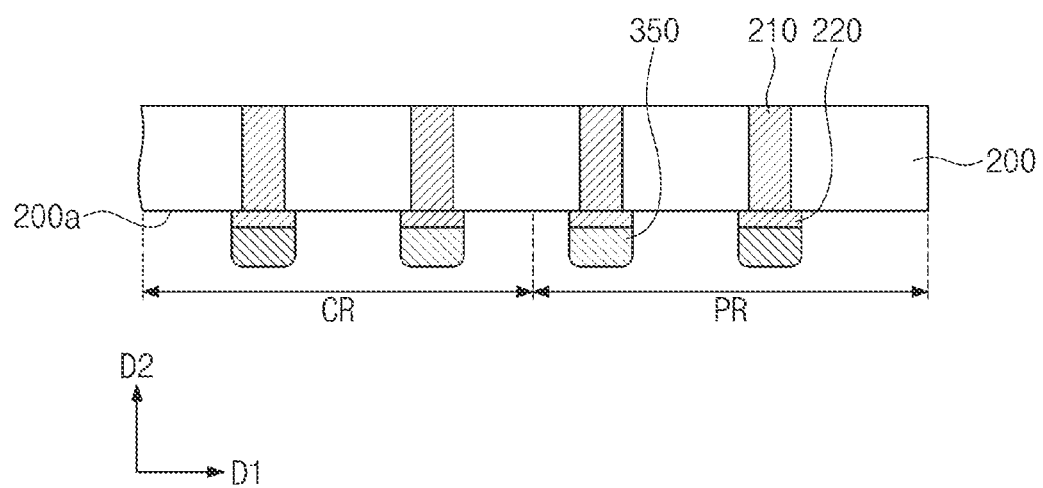

Referring to FIG. 10, the second die 200 may be provided. The second die 200 may be formed of or include a semiconductor material. For example, the second die 200 may be a silicon substrate, a germanium substrate, or a silicon-germanium substrate or the like.

The second through electrode 210 may be formed in the second die 200. The formation of the second through electrode 210 may include forming a penetration hole (not shown) in the second die 200, depositing a conductive material layer (not shown) to fill the penetration hole, and planarizing or etching the conductive material layer to expose the bottom surface 200a of the second die 200. In an embodiment, the penetration hole may be formed by a dry etching process or a wet etching process. In an embodiment, the conductive material layer may for example be deposited by at least one of chemical vapor deposition (CVD), plasma-enhanced CVD (PECVD), high density plasma CVD (HDP-CVD), sputtering, metal organic CVD (MOCVD), and atomic layer deposition (ALD) methods. The second through electrode 210 may be formed of or include at least one of conductive materials. For example, the second through electrode 210 may be formed at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr).

The second pad 220 may be formed on the second through electrode 210. For example, the formation of the second pad 220 may include forming a metal layer (not shown) on the second die 200 and removing a portion of the metal layer. The process of forming the metal layer may be performed using at least one of chemical vapor deposition (CVD), physical vapor deposition (PVD), and atomic layer deposition (ALD) methods. The process of removing the portion of the metal layer may include patterning the metal layer using a patterning mask (not shown). Alternatively, the formation of the second pad 220 may include forming a patterning mask (not shown), forming a metal layer on the patterning mask and the second die 200, and lifting off a portion of the metal layer located on the patterning mask. The second pad 220 may be formed of or include at least one of conductive materials. The second pad 220 may be formed of a second metal. For example, the second metal may include copper (Cu), nickel (Ni), or alloys. In an embodiment, a plurality of the second pads 220 may be provided. For example, a plurality of the second pads 220 may be respectively formed on the second through electrodes 210.

A solder material layer 350 may be provided on the second pad 220. The solder material layer 350 may be formed by an electroplating method. For example, a mask pattern may be formed on the bottom surface 200a of the second die 200 to expose the second pad 220, and then, a plating process, in which the exposed second pad 220 is used as a seed layer, may be performed to form the solder material layer 350. The solder material layer 350 may be formed of or include at least one of solder materials. For example, the solder material may be formed of or include at least one of tin-silver alloys.

Figure 11:
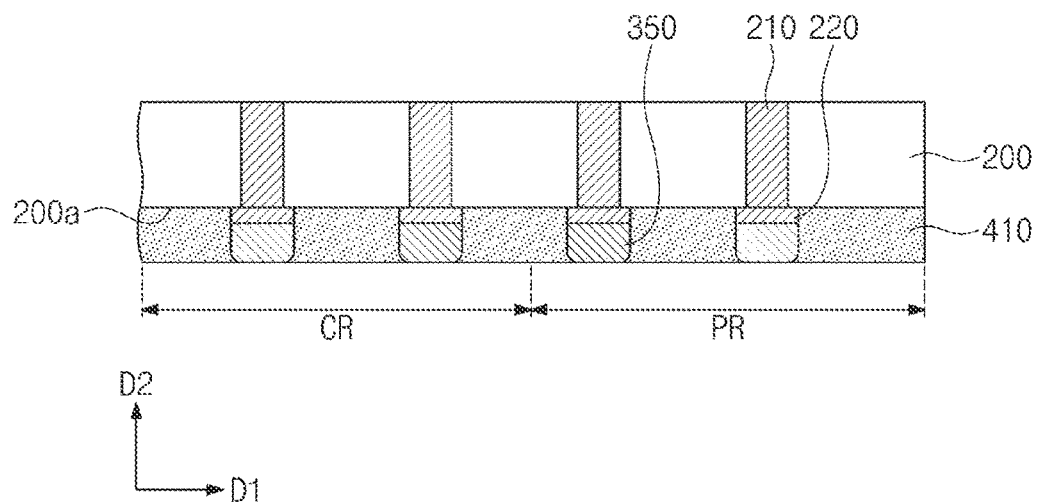

Referring to FIG. 11, a preliminary insulating layer 410 may be provided on the bottom surface 200a of the second die 200 to cover the second pad 220 and the solder material layer 350. The preliminary insulating layer 410 may be used to protect the second pad 220, the solder material layer 350, and the second die 200, and to connect the second die 200 to the first die 100 in a subsequent process. For example, the preliminary insulating layer 410 may be one of a non-conductive film (NCF) and a non-conductive paste (NCP). Here, the non-conductive film (NCF) may be formed on the second die 200 by a laminating process. The preliminary insulating layer 410 may for example be formed of or include at least one of insulating polymers. In an embodiment, the preliminary insulating layer 410 may be formed to expose a bottom surface of the solder material layer 350.

Figure 12:
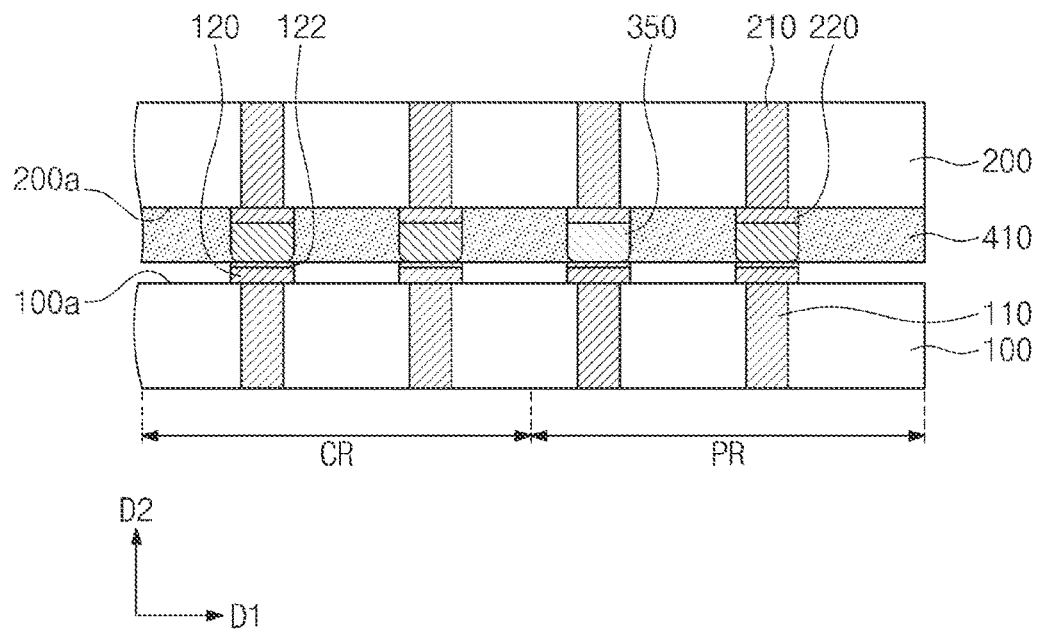

Referring to FIG. 12, the second die 200 may be provided on the first die 100. The first and second dies 100 and 200 may be placed such that the top surface 100a of the first die 100 faces the bottom surface 200a of the second die 200. The first and second pads 120 and 220 may be aligned to each other in the second direction D2. The exposed bottom surface of the solder material layer 350 may be in contact with the oxidation-preventing layer 122 on the first pad 120.

Figure 13:
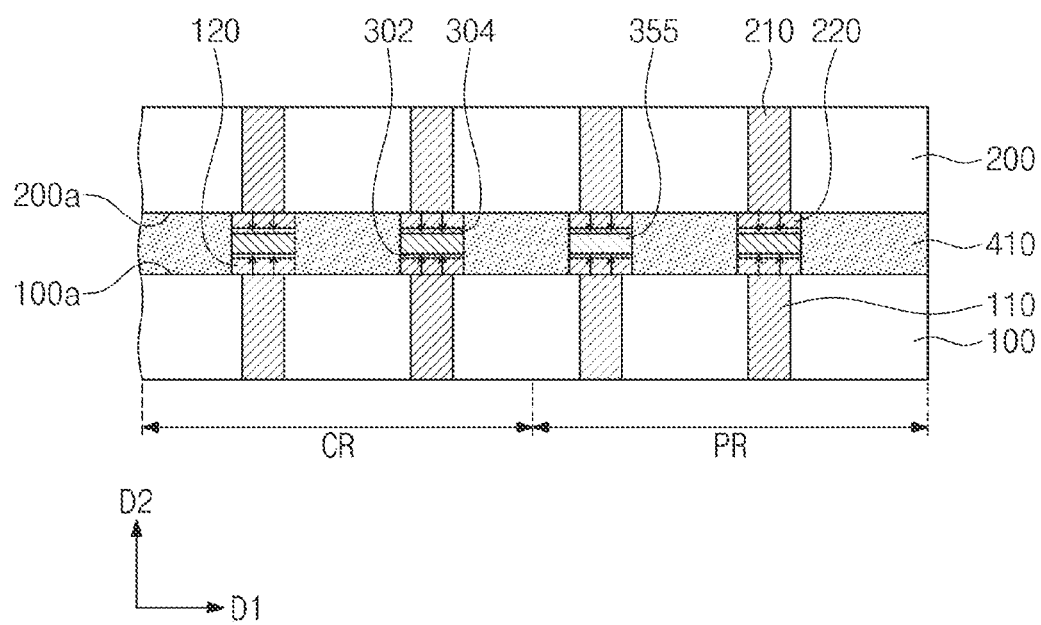

In general, a die bonding process may include a process of reflowing a soldering material between dies. As shown in FIG. 13, a solder terminal 355 may be formed by reflowing the solder material layer 350. The process of reflowing the solder material layer 350 may be performed at a low temperature. For example, the solder material layer 350 may be reflowed at a temperature of about 138° C. to 180° C. During the reflowing of the solder material layer 350, the solder material layer 350 may be melted to a liquid state. Due to the surface tension of the liquid solder material, the solder terminal 355 may be formed in a bead shape. The solder terminal 355 may connect the first and second pads 120 and 220 to each other. If, during the reflow process, the temperature of the solder material layer 350 is lower than 138° C., a portion of the solder material layer 350 may be melted to the liquid state but another portion may not be melted. In this case, the solder terminal 355 may be deteriorated or may have deteriorated properties. By contrast, if the temperature of the solder material layer 350 is higher than 180° C., the first and second dies 100 and 200 may be thermally damaged. For example, circuit patterns in the first and second dies 100 and 200 may be damaged. During the reflow process of the solder material layer 350, the first and second metallic materials of the first and second pads 120 and 220 may be diffused into the solder material layer 350 through an interface between the solder material layer 350 and the first pad 120, and an interface between the solder material layer 350 and the second pad 220, and in this case, interface layers 304 may be formed near the interfaces. The interface layer 304 may be formed of or include an intermetallic compound (IMC) which is formed by the diffusion of the first metallic material of the first pad 120 or the second metallic material of the second pad 220 into the solder material of the solder material layer 350. For example, the first or second metallic material may be activated along a grain boundary in the solder material layer 350 or a direction perpendicular to the interfaces between the pads 120 and 220 and the solder material layer 350, and in this case, the interface layer 304 may be grown along the grain boundary or the direction. At an electrical connection between the first and second pads 120 and 220, electrical signals may pass through three material layers (i.e., the interface layer 304, the solder terminal 355, and the interface layer 304), and in this case, an electric resistance (e.g., an interface resistance) between the first and second pads 120 and 220 may be increased. Furthermore, as a result of migration of the solder material from the solder material layer 350 to the interface layer 304, a void may be formed in the solder terminal 355. The presence of the void may lead to an increase in electrical resistance of the solder terminal 355 and deterioration in mechanical stability of the solder terminal 355.

In contrast, in a die bonding method according to embodiments of the inventive concepts, it is possible to prevent the deterioration of the mechanical stability and electric characteristics. This will be hereinafter described in more detail with reference to FIGS. 14 to 16.

Figure 14:
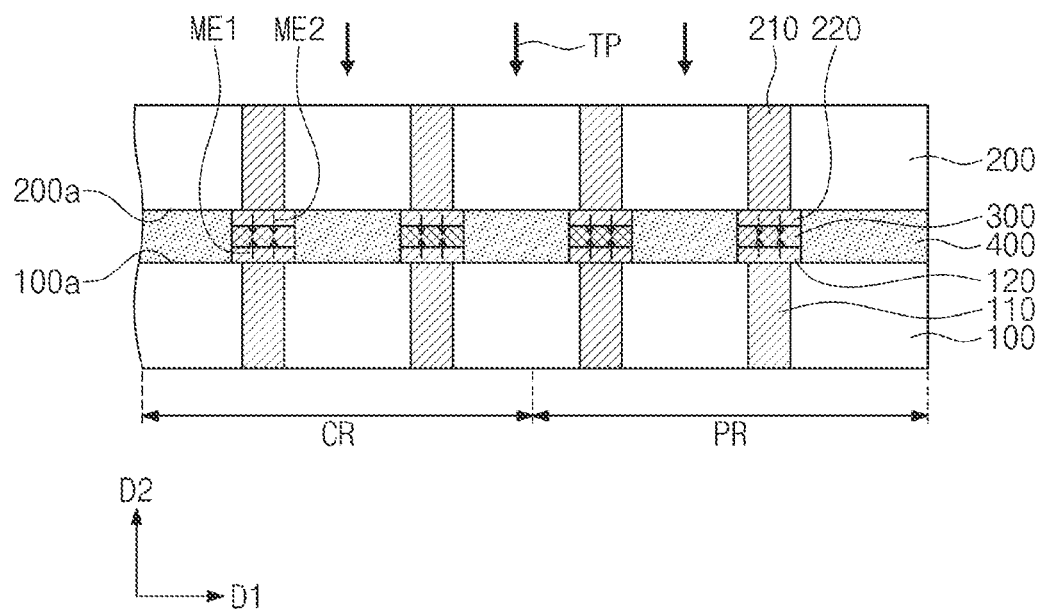

Referring to FIG. 14, a thermocompression bonding process may be performed on the first and second dies 100 and 200. For example, heat may be provided to the second die 200 during exerting of pressure TP on the second die 200 in a direction toward the first die 100. For example, the thermocompression bonding process may be performed at a temperature between a melting temperature of the solder material layer 350 and a softening temperature of the preliminary insulating layer 410. In the case where the heat is applied to the solder material layer 350, a first metallic material ME1 of the first pad 120 and a second metallic material ME2 of the second pad 220 may be diffused into the solder material layer 350. The first and second metallic materials ME1 and ME2 may react with the solder material of the solder material layer 350 to form an intermetallic compound. In an embodiment, the thermocompression bonding process may be performed until the entirety of the solder material layer 350 reacts with the first and second metallic materials ME1 and ME2. During the thermocompression bonding process, the first and second metallic materials ME1 and ME2, which are diffused into the solder material layer 350, may be mixed with the solder material for a long time (e.g., a long enough time so that the entirety of the solder material layer 350 reacts with the first and second metallic materials ME1 and ME2), and in the melted solder material layer 350, concentrations of the first and second metallic materials ME1 and ME2 may be constant regardless of position in the melted solder material layer 350. In other words, only a single material layer may be formed between the first and second pads 120 and 220. Thus, it may be possible to fabricate the semiconductor package with improved structural stability in that, between the first and second pads 120 and 220, an interface between different materials does not serve as a starting point of a crack. Moreover, since the first and second metallic materials ME1 and ME2 respectively escape or move from the first and second pads 120 and 220, a surface of the first or second pad 120 or 220 in contact with the solder material layer 350 may have an increased surface roughness.

After the melting of the solder material layer 350 between the first and second pads 120 and 220 and the softening of the preliminary insulating layer 410, a distance between the first and second dies 100 and 200 may be reduced by the pressure TP in the thermocompression bonding process. Thus, the distance between the first and second dies 100 and 200 may be small in the final structure of the semiconductor package, and the semiconductor package may be fabricated to have small size. In addition, since the distance between the first and second pads 120 and 220 is reduced during the process of forming the intermetallic compound (IMC) between the first and second pads 120 and 220, it may be possible to prevent an empty space (e.g., a void), which may be caused by the escape of the solder material, from being formed in the melted solder material layer 350, or it may be possible to push the void out of the solder material layer 350. Accordingly, it may be possible to fabricate a semiconductor package with improved structural stability.

The melted solder material layer 350 may be cooled to form the connection terminal 300. Here, the insulating layer 400 may be hardened. Only the connection terminal 300, which is formed of or includes the intermetallic compound (IMC), may be provided between the first and second pads 120 and 220, and the connection terminal 300 may be in direct contact with the first and second pads 120 and 220. During the formation of the connection terminal 300, the softened preliminary insulating layer 410 may be hardened to form the insulating layer 400. The insulating layer 400 may be formed to enclose the connection terminal 300 and may protect the connection terminal 300 from external impact or stress. In addition, since the connection terminal 300 and the insulating layer 400 are formed at the same time, the insulating layer 400 may protect the connection terminal 300 from warpage or stress caused by a change in temperature during the cooling process. Thus, it may be possible to fabricate a semiconductor package with improved structural stability and to reduce a failure, which may occur in a process of fabricating the semiconductor package.

As a result of the afore-described fabrication process, the semiconductor package may be fabricated to have the structure of FIG. 1.

Figure 15:
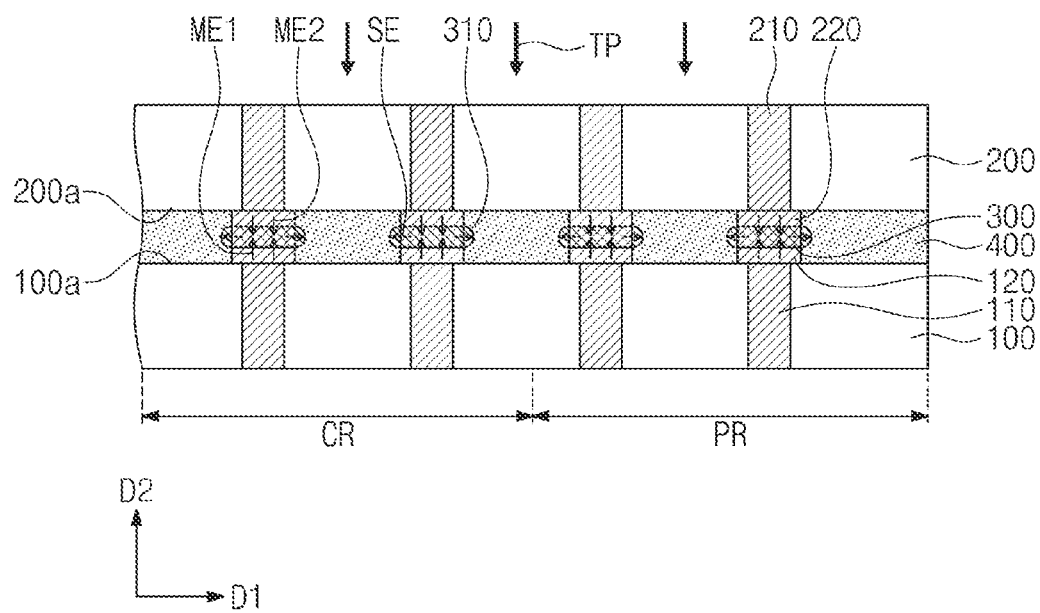

In an embodiment, during the thermocompression bonding process, a portion of the solder material of the solder material layer 350 may not react with the first and second metallic materials ME1 and ME2, and in this case, a residual solder material SE may be formed. As shown in FIG. 15, the residual solder material SE may be formed on the side surface of the connection terminal 300. The residual solder material SE may inflow into the softened preliminary insulating layer 410 (e.g., see FIG. 13) and may be enclosed by the softened preliminary insulating layer 410. Thereafter, during the cooling process, the residual solder material SE may be cooled to form the solder portion 310. The solder portion 310 may enclose the side surface of the connection terminal 300.

As a result of the afore-described fabrication process, the semiconductor package may be fabricated to have the structure of FIG. 6.

Figure 16:
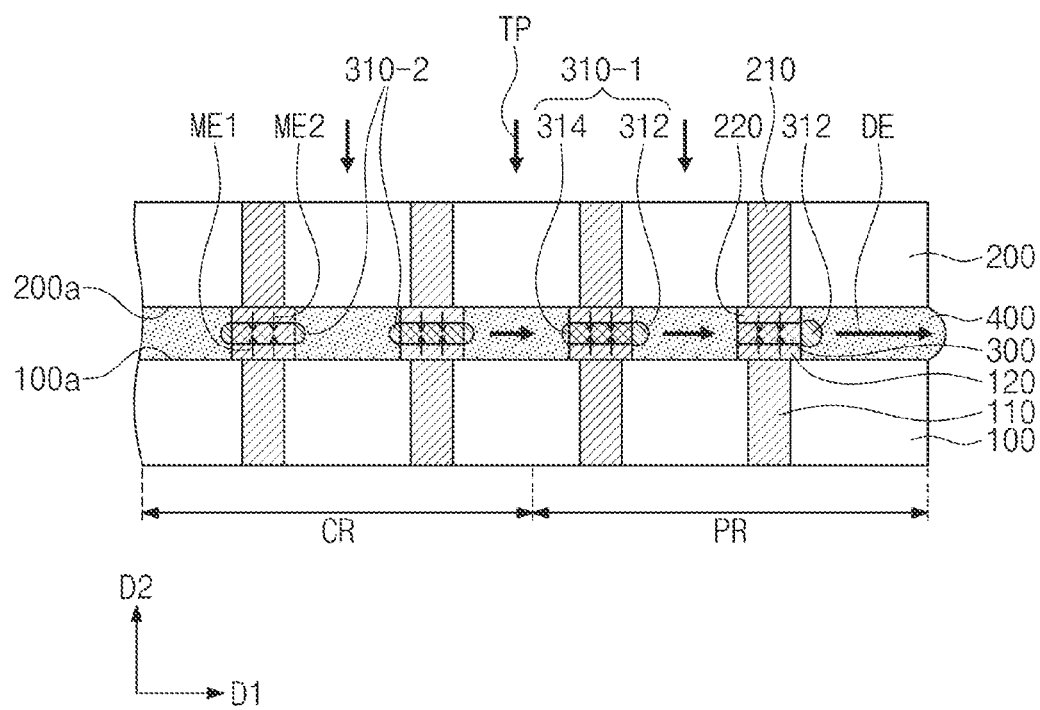

In an embodiment, the solder portion 310 may be formed to have a position-dependent shape. As shown in FIG. 16, during the thermocompression bonding process, a softened preliminary insulating layer 410 of FIG. 13 may have a fluidic property, as depicted by the arrows DE. For example, when viewed in a plan view, the flowing preliminary insulating layer DE may flow from a center of the first die 100 in an outward direction. In other words, the preliminary insulating layer DE may flow from the center region CR toward the peripheral region PR. Here, a flow rate of the preliminary insulating layer DE may be higher on the center region CR than on the peripheral region PR. The flowing preliminary insulating layer DE may exert a pressure on an ejected portion of the solder material SE (e.g., see FIG. 15), and in this case, the shape of the solder portion 310 may be changed. For example, as described with reference to FIGS. 7 and 8, on the peripheral region PR, an ejected amount of the solder material SE may be greater in a direction toward the side surface of the first die 100 than in a direction toward the center region CR. The smaller the distance to the side surface of the first die 100, the greater the difference between the amounts of the solder material SE ejected toward the side surface of the first die 100 and toward the center region CR.

As a result of the afore-described fabrication process, the semiconductor package may be fabricated to have the structure of FIG. 7.

Figure 17:
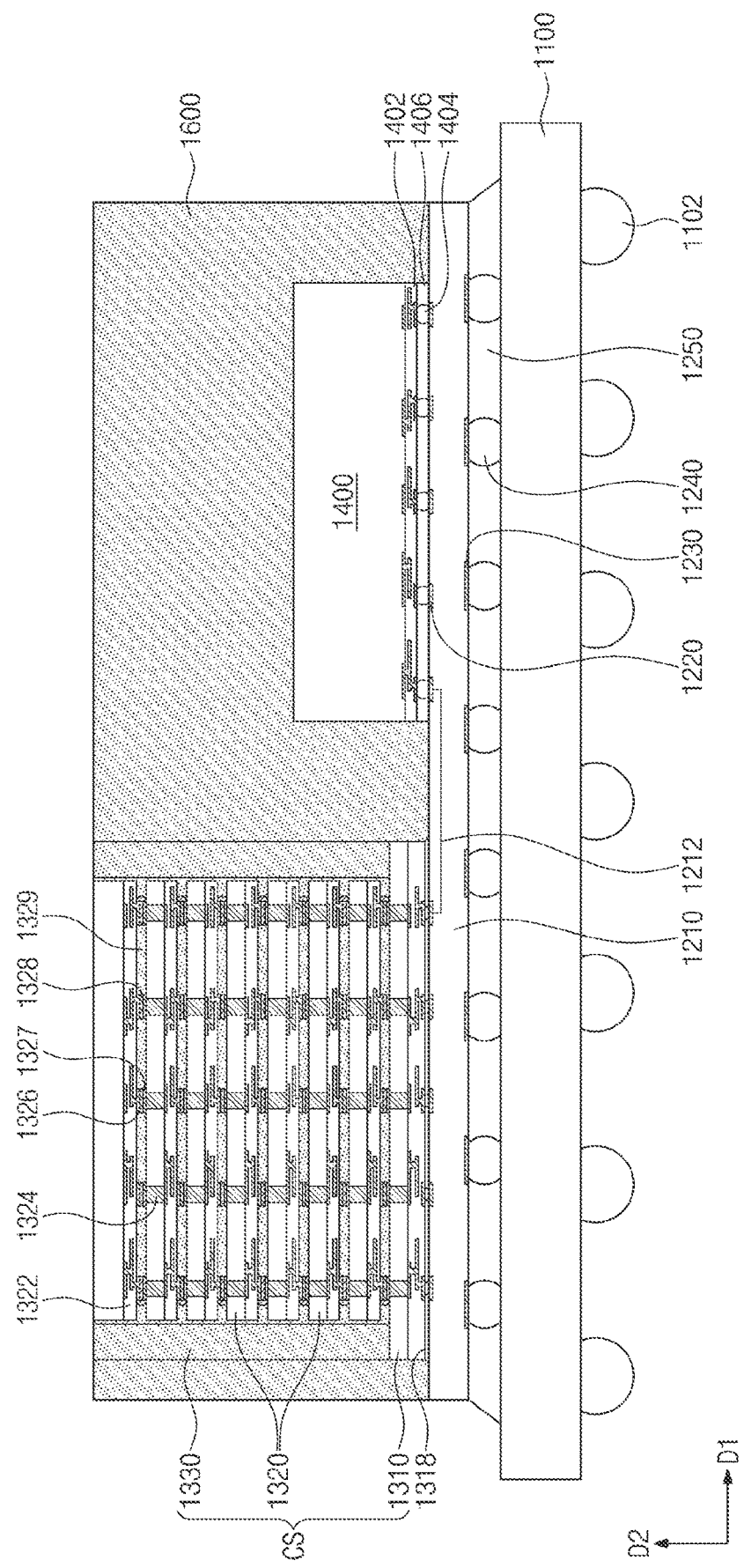
FIG. 17 illustrates a sectional view of a semiconductor package according to embodiments of the inventive concepts.

FIG. 17 illustrates a sectional view of a semiconductor package according to embodiments of the inventive concepts.

Referring to FIG. 17, a package substrate 1100 may be provided. The package substrate 1100 may include a printed circuit board (PCB), which has signal patterns disposed on its top surface. Alternatively, the package substrate 1100 may be a structure, in which insulating and interconnection layers are alternately stacked. The package substrate 1100 may include pads, which are disposed on its top surface.

Outer terminals 1102 may be disposed under the package substrate 1100. In detail, the outer terminals 1102 may be disposed on terminal pads (not shown), which are provided on a bottom surface of the package substrate 1100. The outer terminals 1102 may include solder balls or solder bumps, and the semiconductor package may for example have a ball grid array (BGA) structure, a fine ball grid array (FBGA) structure, or a land grid array (LGA) structure, depending on the kind and arrangement of the outer terminals 1102.

An interposer substrate 1210 may be provided on the package substrate 1100. The interposer substrate 1210 may be mounted on a top surface of the package substrate 1100. The interposer substrate 1210 may include first substrate pads 1220, which are provided near a top surface thereof and are exposed to the outside thereof, and second substrate pads 1230, which are provided near a bottom surface thereof and are exposed to the outside thereof. Here, the first substrate pads 1220 may have top surfaces that are substantially coplanar with the top surface of the interposer substrate 1210. The interposer substrate 1210 may be configured to provide redistribution for a chip stack CS and a second semiconductor chip 1400, which will be described hereinafter. For example, the first and second substrate pads 1220 and 1230 may be electrically connected to each other by circuit interconnection lines in the interposer substrate 1210, and they, along with the circuit interconnection line, may constitute a redistribution circuit. The first and second substrate pads 1220 and 1230 may be formed of or include at least one of conductive materials (e.g., metallic materials). For example, the first and second substrate pads 1220 and 1230 may be formed of or include copper (Cu). The interposer substrate 1210 may include an insulating material or silicon (Si). In the case where the interposer substrate 1210 includes silicon (Si), the interposer substrate 1210 may be a silicon interposer substrate with a through electrode, and here, the through electrode may be provided to vertically penetrate the interposer substrate 1210.

Substrate terminals 1240 may be disposed on the bottom surface of the interposer substrate 1210. The substrate terminals 1240 may be provided between the pads of the package substrate 1100 and the second substrate pads 1230 of the interposer substrate 1210. The substrate terminals 1240 may electrically connect the interposer substrate 1210 to the package substrate 1100. For example, the interposer substrate 1210 may be mounted on the package substrate 1100 in a flip-chip bonding manner. The substrate terminals 1240 may include solder balls, solder bumps, or the like.

A first under-fill layer 1250 may be provided between the package substrate 1100 and the interposer substrate 1210. The first under-fill layer 1250 may be provided to fill a space between the package substrate 1100 and the interposer substrate 1210 and to enclose the substrate terminals 1240.

The chip stack CS may be disposed on the interposer substrate 1210. The chip stack CS may include a base substrate, first semiconductor chips 1320 stacked on the base substrate, and a first mold layer 1330 enclosing the first semiconductor chips 1320. Hereinafter, the structure of the chip stack CS will be described in more detail.

The base substrate may be a base semiconductor chip 1310. For example, the base substrate may be a wafer-level semiconductor substrate that is formed of a semiconductor material (e.g., silicon). A thickness of the base semiconductor chip 1310 may range from 40 μm to 100 μm.

The base semiconductor chip 1310 may include a base circuit layer and a base penetration electrode. The base circuit layer may be provided on a bottom surface of the base semiconductor chip 1310. The base circuit layer may include an integrated circuit. For example, the base circuit layer may be a memory circuit. In other words, the base semiconductor chip 1310 may be a memory chip (e.g., a DRAM chip, an SRAM chip, an MRAM chip, or a FLASH memory chip). The base through electrode may penetrate the base semiconductor chip 1310 in the second direction D2. The base through electrode and the base circuit layer may be electrically connected to each other. The bottom surface of the base semiconductor chip 1310 may be an active surface. Although FIG. 17 illustrates an example in which the base substrate is the base semiconductor chip 1310, the inventive concepts are not limited to this example, and in other embodiments the base substrate may not include the base semiconductor chip 1310.

The base semiconductor chip 1310 may further include a first connection terminal(s). The first connection terminals may be provided on the bottom surface of the base semiconductor chip 1310 and may be electrically connected to the base circuit layer.

A first semiconductor chip 1320 from among the first semiconductor chips 1320 may be mounted on the base semiconductor chip 1310. In other words, the first semiconductor chip 1320 and the base semiconductor chip 1310 may form a chip-on-wafer (COW) stricture. A thickness of the first semiconductor chip 1320 may for example range from 40 μm to 100 μm. A width of the first semiconductor chip 1320 may be smaller than a width of the base semiconductor chip 1310.

The first semiconductor chip 1320 may include a first circuit layer 1322 and a first through electrode 1324. The first circuit layer 1322 may include a memory circuit. In other words, the first semiconductor chip 1320 may be a memory chip (e.g., a DRAM chip, an SRAM chip, an MRAM chip, or a FLASH memory chip). The first circuit layer 1322 may include the same circuit as the base circuit layer, but the inventive concepts are not limited to this example. The first through electrode 1324 may penetrate the first semiconductor chip 1320 in the second direction D2. The first through electrode 1324 and the first circuit layer 1322 may be electrically connected to each other. A bottom surface of the first semiconductor chip 1320 may be an active surface. First bumps 1328 may be provided on the bottom surface of the first semiconductor chip 1320. The first bumps 1328 may be provided between the base semiconductor chip 1310 and the first semiconductor chip 1320 to electrically connect the base semiconductor chip 1310 to the first semiconductor chip 1320. The first bumps 1328 may be the same as or similar to the connection terminal 300 described with reference to FIG. 1. For example, the first bump 1328 may be provided between a base pad, which is provided on a top surface of the base semiconductor chip 1310, and a lower chip pad 1326, which is provided on the bottom surface of the first semiconductor chip 1320. Here, the first bumps 1328 may be formed of or include an intermetallic compound, which is made of a metallic material of the base pad, a metallic material of the lower chip pad 1326, and a solder material.

A plurality of the first semiconductor chips 1320 may be provided. For example, a plurality of the first semiconductor chips 1320 may be stacked on the base semiconductor chip 1310. In an embodiment, the chip stack CS may for example include 8 to 32 first semiconductor chips 1320, which are stacked on the first semiconductor chip 1320. Here, the uppermost one of the first semiconductor chips 1320 may not include the first through electrode 1324. In addition, the uppermost one of the first semiconductor chips 1320 may be thicker than at least one of the others. The first bumps 1328 may also be provided between the first semiconductor chips 1320. Similarly, the first bumps 1328 between the first semiconductor chips 1320 may be the same as or similar to the connection terminal 300 described with reference to FIG. 1. For example, the first bump 1328 may be provided between an upper chip pad 1327, which is provided on a top surface of one of the first semiconductor chips 1320, and the lower chip pad 1326 of another one of the first semiconductor chips 1320 thereon. Here, the first bumps 1328 may be formed of or include an intermetallic compound, which is made of a metallic material of the upper chip pad 1327, a metallic material of the lower chip pad 1326, and a solder material.

An adhesive layer 1329 may be provided between the first semiconductor chips 1320. The adhesive layer 1329 may include a non-conductive film (NCF). The adhesive layer 1329 may be interposed between the first semiconductor chips 1320 and between the first bumps 1328 to prevent a short circuit from being formed between the first bumps 1328. The adhesive layer 1329 may be extended to cover the side surfaces of the first semiconductor chips 1320.

The first mold layer 1330 may be disposed on the top surface of the base semiconductor chip 1310. The first mold layer 1330 may be provided to cover the base semiconductor chip 1310 and to enclose the first semiconductor chips 1320. A top surface of the first mold layer 1330 may be coplanar with the top surface of the uppermost one of the first semiconductor chips 1320, and thus, the uppermost one of the first semiconductor chip 1320 may not be covered with the first mold layer 1330 and may be exposed to the outside. The first mold layer 1330 may be formed of or include an insulating polymer material. For example, the first mold layer 1330 may be formed of or include an epoxy molding compound (EMC).

The chip stack CS may be provided to have the afore-described structure. The chip stack CS may be mounted on the interposer substrate 1210. For example, the chip stack CS may be coupled to the first substrate pads 1220 of the interposer substrate 1210 through stack connection terminals of the base semiconductor chip 1310.

A second under-fill layer 1318 may be provided between the interposer substrate 1210 and the chip stack CS. The second under-fill layer 1318 may be provided to fill a space between the interposer substrate 1210 and the base semiconductor chip 1310 and to enclose the stack connection terminals.

The second semiconductor chip 1400 may be disposed on the interposer substrate 1210. The second semiconductor chip 1400 may be disposed to be spaced apart from the chip stack CS along the first direction D1. A thickness of the second semiconductor chip 1400 may be thicker than the thickness of the first semiconductor chips 1320. The thickness of the second semiconductor chip 1400 may for example range from 300 μm to 780 μm. The second semiconductor chip 1400 may be formed of or include a semiconductor material (e.g., silicon). The second semiconductor chip 1400 may include a second circuit layer 1402. The second circuit layer 1402 may include a logic circuit. In other words, the second semiconductor chip 1400 may be a logic chip. A bottom surface of the second semiconductor chip 1400 may be an active surface, and a top surface of the second semiconductor chip 1400 may be an inactive surface. Second bumps 1404 may be provided on the bottom surface of the second semiconductor chip 1400. For example, the second semiconductor chip 1400 may be coupled to the first substrate pads 1220 of the interposer substrate 1210 through the second bumps 1404. The second semiconductor chip 1400 may be electrically connected to the chip stack CS or an external device through a circuit interconnection line 1212 in the interposer substrate 1210. A third under-fill layer 1406 may be provided between the interposer substrate 1210 and the second semiconductor chip 1400. The third under-fill layer 1406 may be provided to fill a space between the interposer substrate 1210 and the second semiconductor chip 1400 and to enclose the second bumps 1404.

A second mold layer 1600 may be provided on the interposer substrate 1210. The second mold layer 1600 may cover the top surface of the interposer substrate 1210. The second mold layer 1600 may be provided to enclose the chip stack CS and the second semiconductor chip 1400. A top surface of the second mold layer 1600 may be located at the same level as the top surface of the chip stack CS. The second mold layer 1600 may be formed of or include at least one of insulating materials. For example, the second mold layer 1600 may include an epoxy molding compound (EMC).

In a semiconductor package according to embodiments of the inventive concepts, only a single material layer (e.g., a connection terminal made of an intermetallic compound) may be provided between pads. In other words, an interface which may be formed between different materials may be absent in the connection terminal, and thus, the connection terminal may have improved structural stability.

In a method of fabricating a semiconductor package according to embodiments of the inventive concepts, a soldering process may be performed in a thermocompression bonding manner, and thus, a distance between dies may be decreased by a pressure applied during the soldering process. Accordingly, it may be possible to reduce a distance between the dies in the semiconductor package and a size of the semiconductor package. In addition, it may be possible to prevent a void from being formed in a melted solder material between the pads or to push such a void out of the solder material. Accordingly, it may be possible to fabricate a semiconductor package with improved structural stability.

In addition, since a connection terminal and an insulating layer are formed at the same time, the insulating layer may protect the connection terminal from warpage or stress which is caused by a change in temperature during a cooling process. Thus, it may be possible to fabricate a semiconductor package with improved structural stability and to reduce failure, which may occur in a process of fabricating the semiconductor package.

While example embodiments of the inventive concepts have been particularly shown and described, it should be understood by one of ordinary skill in the art that variations in form and detail may be made therein without departing from the spirit and scope of the attached claims.

What is claimed is:

1. A semiconductor package, comprising:
   a first die;
   second dies stacked on a top surface of the first die, each of the second dies comprising a top surface and a bottom surface, a first pad and a second pad on the top surfaces of the second dies, and a third pad and a fourth pad on the bottom surfaces of the second dies;
   first connection terminals between the second dies, the first connection terminals respectively connect the first pads and the third pads that vertically overlap each other;
   second connection terminals between the second dies, the second connection terminals respectively connect the second pads and the fourth pads that vertically overlap each other;
   an insulating layer filling regions between the second dies; and
   outer terminals on a bottom surface of the first die and connecting the first die to a substrate,
   wherein the first pads and the third pads are disposed adjacent to side surfaces of the second dies, and distances between the first and third pads and the side surfaces of the second dies are less than distances between the second and fourth pads and the side surfaces of the second dies,
   the first connection terminals comprise an intermetallic compound made of a solder material and metallic material of the first pads and the third pads,
   the second connection terminals comprise an intermetallic compound made of the solder material and a metallic material of the second pads and the fourth pads, and
   a concentration of the solder material in the solder portions is greater than a concentration of the metallic material in the solder portions.

2. The semiconductor package of claim 1, wherein the solder portions of the first connection terminals comprise the solder material and do not include the metallic material of the first connection terminals.

3. The semiconductor package of claim 1, wherein the solder portions are respectively spaced apart from side surfaces of the first pads and side surfaces of the third pads.

4. The semiconductor package of claim 1, wherein the solder portions enclose the first connection terminals when viewed in plan view, and
   lengths of the solder portions protruding from the first connection terminals in a direction toward the side surfaces of the second dies are larger than lengths of the solder portions protruding from the first connection terminals in a direction toward a center portion of the second dies.

5. The semiconductor package of claim 1, wherein portions of the side surfaces of the first connection terminals are in contact with the insulating layer.

6. The semiconductor package of claim 1, wherein the metallic material comprises nickel (Ni) or copper (Cu), and the solder material comprises tin (Sn).

7. The semiconductor package of claim 1, wherein a width of the first connection terminals is equal to or smaller than a width of the first pads and a width of the third pads.

8. The semiconductor package of claim 1, wherein a surface roughness of a top surface of the first pads in contact with the first connection terminals is higher than a surface roughness of a bottom surface of the first pads, and
   a surface roughness of a bottom surface of the third pads in contact with the first connection terminal is higher than a surface roughness of a top surface of the third pads.

9. A semiconductor package, comprising:
a first die;
through electrodes penetrating the first die;
a first pad on a top surface of the first die and coupled to a through electrode from among the through electrodes;
a second die on the first die;
a second pad on a bottom surface of the second die;
a first connection terminal connecting the first pad to the second pad; and
an insulating layer filling a region between the first die and the second die and enclosing the first connection terminal,
wherein the first connection terminal is formed one material which is an intermetallic compound made of a solder material and metallic material of the first pad and the second pad.

10. The semiconductor package of claim 9, wherein a concentration of the metallic material in the first connection terminal is substantially constant regardless of a distance from the first pad or the second pad.

11. The semiconductor package of claim 9, wherein a side surface of the first connection terminal has a concave portion which is recessed from a side surface of the first pad and a side surface of the second pad in a direction parallel to the top surface of the first die.

12. The semiconductor package of claim 11, wherein a depth of the side surface of the first connection terminal, which is defined as a distance from the side surface of the first pad to a bottom surface of the concave portion along the direction, is larger than 0 μm and is equal to or smaller than 2 μm.

13. The semiconductor package of claim 11, wherein at a boundary between the first connection terminal and the first pad, a first width of the first connection terminal is equal to a width of the first pad,
at a boundary between the first connection terminal and the second pad, a second width of the first connection terminal is equal to a width of the second pad, and
a third width of a center portion of the first connection terminal is smaller than the width of the first pad and the width of the second pad.

14. The semiconductor package of claim 9, further comprising a solder portion protruding from a side surface of the first connection terminal into the insulating layer,
wherein the solder portion comprises the solder material and does not include the metallic material.

15. The semiconductor package of claim 14, wherein the solder portion is spaced apart from a side surface of the first pad and a side surface of the second pad.

16. The semiconductor package of claim 14, wherein a width of the solder portion in a direction parallel to the top surface of the first die ranges from 2 μm to 4 μm.

17. A semiconductor package, comprising:
a first die;
through electrodes penetrating the first die;
a first pad and a second pad on a top surface of the first die and coupled to a through electrode from among the through electrodes;
a second die on the first die;
a third pad and a fourth pad on a bottom surface of the second die;
a first connection terminal connecting the first pad to the third pad;
a second connection terminal connecting the second pad to the fourth pad; and
an insulating layer filling a region between the first die and the second die and enclosing the first connection terminal and the second connection terminal,
wherein the first pads and the third pads are disposed adjacent to side surface of the second die,
the first connection terminal comprises an intermetallic compound made of a solder material and metallic material of the first pad and the second pad,
the second connection terminals comprise an intermetallic compound made of the solder material and a metallic material of the second pads and the fourth pads,
the first connection terminal comprises a first side surface facing to the side surface of the second die, and a second side surface of the first connection terminal which is opposite to the side surface of the second die,
the first connection terminal further comprises a first solder portion protruding from the first side surface toward the side surface of the second die,
a second side surface of the first connection terminal is in contact with the insulating layer, and
a concentration of the metallic material in the first connection terminal is substantially constant regardless of a distance from the first pad or the second pad.

18. The semiconductor package of claim 17, wherein the first solder portion of the first connection terminal comprises the solder material and does not include the metallic material of the first connection terminal.

19. The semiconductor package of claim 17, wherein the second connection terminal further comprises a second solder portion protruding from a side surface of the second connection terminal, and
the second solder portion enclose the second connection terminal when viewed in plan view.

20. The semiconductor package of claim 17, wherein the first solder portion is spaced apart from a side surface of the first pad and a side surface of the third pad.

* * * * *